(12) United States Patent
Sumithpibul et al.

(10) Patent No.: US 7,922,877 B2
(45) Date of Patent: Apr. 12, 2011

(54) METHOD AND APPARATUS FOR PLATING A SEMICONDUCTOR PACKAGE

(75) Inventors: Chalermsak Sumithpibul, Samutprakarn (TH); Somchai Nondhasitthichai, Bangkok (TH); Apichart Phaowongsa, Prakarn (TH)

(73) Assignee: Utac Thai Limited, Bangna Bangkok (TH)

( * ) Notice: Subject to any disclaimer, the term of this patent is extended or adjusted under 35 U.S.C. 154(b) by 0 days.

(21) Appl. No.: 12/639,269

(22) Filed: Dec. 16, 2009

(65) Prior Publication Data
US 2010/0140081 A1   Jun. 10, 2010

Related U.S. Application Data

(62) Division of application No. 12/128,828, filed on May 29, 2008, now Pat. No. 7,718,522.

(60) Provisional application No. 60/940,824, filed on May 30, 2007.

(51) Int. Cl.
*C25D 17/16*   (2006.01)
*C25D 17/22*   (2006.01)

(52) U.S. Cl. .............. 204/213; 204/212; 204/224 R; 204/242; 204/273

(58) Field of Classification Search ............. 204/212, 204/213, 224 R, 242, 273
See application file for complete search history.

(56) References Cited

U.S. PATENT DOCUMENTS

| | | | | |
|---|---|---|---|---|
| 5,441,620 | A | * | 8/1995 | Nishimura et al. ........ 204/230.5 |
| 5,498,325 | A | * | 3/1996 | Nishimura et al. ............ 205/96 |
| 6,261,433 | B1 | * | 7/2001 | Landau ......................... 205/96 |

* cited by examiner

*Primary Examiner* — Bruce F Bell
(74) *Attorney, Agent, or Firm* — Sughrue Mion, PLLC

(57) ABSTRACT

A method of plating a plurality of semiconductor devices includes: applying an electrical power source to an anode terminal and a cathode terminal; placing the plurality of semiconductor devices on a non-conductive platform in a plating solution; moving conductive parts across surfaces of the semiconductor devices to be plated, wherein the conductive parts electrically connect the surfaces of the semiconductor devices to the cathode; and wherein plating particles connected to the anode terminal move to and plate the surfaces of the semiconductor devices.

8 Claims, 11 Drawing Sheets

Top view

Strip form
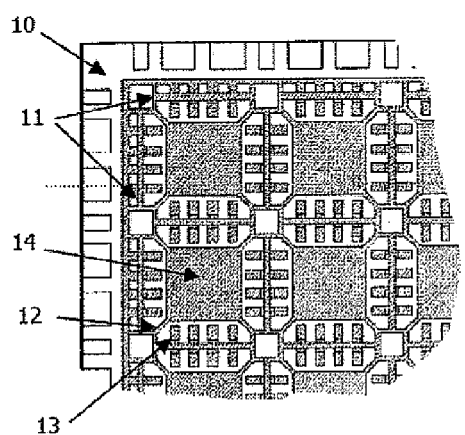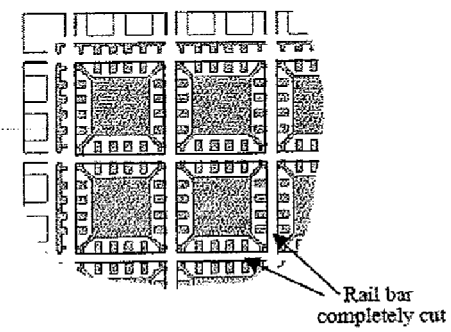
Fig 2A
Fig 2B
Figure 2

Top view

Bottom view

| No. lot. | Reject |
|---|---|
| 1st | 0/252 |
| 2nd | 0/252 |
| 3rd | 0/252 |
| 4th | 0/252 |
| 5th | 0/252 |
| sum | 0/1260 |

Figure 8

| No. lot. | Reject |
|---|---|
| 1st | 0/252 |
| 2nd | 0/252 |
| 3rd | 0/252 |
| 4th | 0/252 |
| 5th | 0/252 |
| sum | 0/1260 |

Figure 9

Solderability test condition :

| 1) Steam Aging Process | 8hrs |
|---|---|
| 2) Solder Pot size | Min 2 lbs |
| 3) Optical Inspection | 7 to 40X scope |
| 4) Flux | Rosin Flux (Kester 145R)/ Rosin Mild Activated Flux |
| 5) Solder Bar compostion | Tin - 95.5%, Ag- 3.9% (3 to 4 wt%), Cu- 0.6% ( 0.5 to 1 wt%)(Solder supplier-Thaifarco/Nihon |
| 6) Solder pot Contamination Control | Change solder once a month or perform contamination test once a month per the contaminant table |
| 7) Flux immersion time | 5 to 10 secs |
| 8) Solder Temperature | 245 +/- 5 deg.C |
| 9) Solder immersion time | 5 +/-0.5 secs |
| 10) Solder immersion/Emersion Rate | Manual Dipping |
| 11) Steam Ager Temperature | 93 +3 / -5 deg.C |
| 12) Steam Ager Component placement | Dead Bug |
| 13) Drying | Air Dry 15mins ( minimum) |
| 14) Solderability test completion | test must be done within 72 hrs once removed from the Steam Ager |
| 15) Angle of Dipping ( leadless pkg) | 20 to 45 deg.C (using naked eye) |
| 16) Cleaning after solder dipping | use IPA/Bioact EC7M |
| 17) Unit verification | 95% solder coverage on lead/dap |

Figure 10

Result :

| Steam age | Reject | | |
|---|---|---|---|
| | 8 hr. | 16 hr. | 24 hr. |
| 1st | 0/22 | 0/22 | 0/22 |
| 2nd | 0/22 | 0/22 | 0/22 |
| 3rd | 0/22 | 0/22 | 0/22 |
| 4th | 0/22 | 0/22 | 0/22 |
| 5th | 0/22 | 0/22 | 0/22 |
| Sum | 0/110 | 0/110 | 0/110 |

Figure 11

METHOD AND APPARATUS FOR PLATING A SEMICONDUCTOR PACKAGE

CROSS-REFERENCE TO RELATED APPLICATIONS

This application is a divisional application of U.S. application Ser. No. 12/128,828 filed on May 29, 2008, now U.S. Pat. No. 7,718,522 which claims priority from U.S. Provisional Application No. 60/940,824 filed on May 30, 2007, the disclosure of which is incorporated herein by reference.

BACKGROUND OF INVENTION

1. Field of Invention

Apparatuses and methods consistent with the present invention relate to a method of electro-plating a semiconductor packages. More particularly, the present invention relates to a apparatus and method of electro-plating singulated semiconductor packages by moving conductive parts and the singulated packages relative to each other.

2. Description of the Related Art

One of the last steps in manufacturing certain types of semiconductor packages, such as QFN packages, is to plate the metal frame with a conductor, such as solder. One such conventional method is to electro-plate a metal, such as solder, to the frame. FIG. 1 is a schematic view of a conventional method of electro-plating a strip of semiconductor packages. The electro-plating apparatus includes a container 1 that is filled with a plating chemical 2, such as Methane Sulfonic acid. An electrical power source 3 is connected to an anode 3a and a cathode 3b. The anode 3a is electrically connected to an anode plate 4 that contains solder particles. The cathode 3b is electrically connected to a clipper and belt that is attached to the metal frame 6 of the semiconductor packages to be plated. The apparatus also includes a circulation pump and filter 7, which circulates the chemical in order to prevent chemical debris sediment.

When an electrical current is applied by the electrical power source through the anode 3a and cathode 3b to the anode plate 4 and metal frame 6, the solder particles on the anode plate move (as shown by item 8) through the plating chemical and become plated onto the metal frame (as shown by item 9).

FIG. 2 illustrates differences between the conventional strip of semiconductor packages and the strip of semiconductor packages that is used in an embodiment of the inventive method. FIG. 2A shows a portion of a metal strip frame 10 that contains rail bars 11, tie bars 12, terminals 13 and die attach pads 14. Each of the rail bars 11, tie bars 12, terminals 13 and die attach pads 14 are electrically connected. As a result, all of the metal surfaces can be plated by the conventional method.

FIG. 2b shows what happens with individual semiconductor packages are singulated, or separated from each other. Specifically, the rail bars are cut. After singulation, the tie bars 12, terminals 13 and die attach pads 14 of each of the singulated packages are no longer electrically connected to the tie bars 12, terminals 13 and die attach pads 14 of the other singulated packages. As a result, because electric current can no longer flow through all of the metal parts, the parts cannot be electro plated.

While the conventional method works well for semiconductors packages on a strip, when the semiconductor packages are singulated prior to electro-plating, a new method is necessary. The need to electro-plate individual packages may arise when not all of the packages on a strip are properly plated during the conventional method. Rather than scrapping the unplated packages, they can be separated from the strip and plated in a separate process.

There is therefore a need to provide apparatuses and methods that can electro plate semiconductor packages that have been singulated.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

In one embodiment a method of plating a plurality of semiconductor devices includes: applying an electrical power source to an anode terminal and a cathode terminal; placing the plurality of semiconductor devices on a non-conductive platform in a plating solution; moving conductive parts across surfaces of the semiconductor devices to be plated, wherein the conductive parts electrically connect the surfaces of the semiconductor devices to the cathode; and wherein plating particles connected to the anode terminal move to and plate the surfaces of the semiconductor devices.

In other embodiments of the above method, the plurality of semiconductor devices are not electrically connected, the conductive parts are shaped as one of spheres, cylinders, polyhedrons, brushes, pins, wheels and hairs, and/or the conductive parts move in a circular direction.

In another embodiment, a method of plating a plurality of semiconductor devices includes: applying an electrical power source to an anode terminal and a cathode terminal; placing the plurality of semiconductor devices on a non-conductive platform in a plating solution; moving surfaces of the semiconductor devices to be plated across conductive parts, wherein the conductive parts electrically connect the surfaces of the semiconductor devices to the cathode; and wherein plating particles connected to the anode terminal move to and plate the surfaces of the semiconductor devices.

In other embodiments of the above method, the plurality of semiconductor devices are not electrically connected and/or the conductive parts are shaped as one of brushes, pins, wheels and hairs.

In another embodiment, a method of plating a plurality of semiconductor devices includes: applying an electrical power source to an anode terminal and a cathode terminal; placing the plurality of semiconductor devices, which may or may not be electrically connected, on a non-conductive platform in a plating solution; moving conductive parts across surfaces of the semiconductor devices to be plated in a first direction, wherein the semiconductor parts are moving in direction opposite to the first direction, wherein the conductive parts electrically connect the surfaces of the semiconductor devices to the cathode; wherein plating particles connected to the anode terminal move to and plate the surfaces of said semiconductor devices.

In other embodiments of the above method, the conductive parts are shaped as one of spheres, cylinders, polyhedrons, brushes, pins, wheels and hairs, and/or the conductive parts move in a circular direction.

In another embodiment, an apparatus for plating a plurality of semiconductor devices includes: a container for holding a plating chemical; an electrical power source connected to an anode terminal and a cathode terminal; a container for holding plating particles connected to the anode terminal; a non-conductive platform for holding the plurality of semiconductor devices, which may or may not be electrically connected; and movable conductive parts that electrically connect surfaces of the semiconductor devices to be plated to the cathode terminal.

In other embodiments of the above apparatus, the apparatus also includes: a conductive enclosure, which may be a ring; a conductive plate; and a conductive support; wherein the conductive enclosure, the conductive plate and the conductive support are electrically connected to said cathode terminal and wherein the conductive enclosure provides the electrical connection between the movable conductive parts and the surfaces of the semiconductor devices to be plated to the cathode terminal.

In other embodiments of the above apparatus, the apparatus includes a stirrer that moves the conductive parts across the surfaces of said semiconductor devices, and/or the conductive parts may be shaped as one of spheres, cylinders, polyhedrons, brushes pins, wheels and hairs.

In another embodiment, an apparatus for plating a plurality of semiconductor devices includes: a container for holding a plating chemical; an electrical power source connected to an anode terminal and a cathode terminal; a container for holding plating particles connected to the anode terminal; a movable non-conductive platform for holding the plurality of semiconductor devices, which may or may not be electrically connected; and conductive parts that electrically connect surfaces of the semiconductor devices to be plated to said cathode terminal.

BRIEF DESCRIPTION OF THE DRAWINGS

The above and/or other aspects of the present invention will become apparent and more readily appreciated from the following description of the exemplary embodiments, taken in conjunction with the accompanying drawings, in which:

FIG. 2 illustrates differences between the conventional strip of semiconductor packages and the strip of semiconductor packages used in an embodiment of the inventive method.

FIG. 8 is a table of visual inspection test results of an embodiment of the inventive method.

FIG. 9 is a table of adhesion test results of an embodiment of the inventive method.

FIG. 10 is a table of solderability test conditions related to an embodiment of the inventive method.

FIG. 11 is a table of solderability test results of an embodiment of the inventive method.

DETAILED DESCRIPTION OF EXEMPLARY EMBODIMENTS OF THE INVENTION

Figure 1:
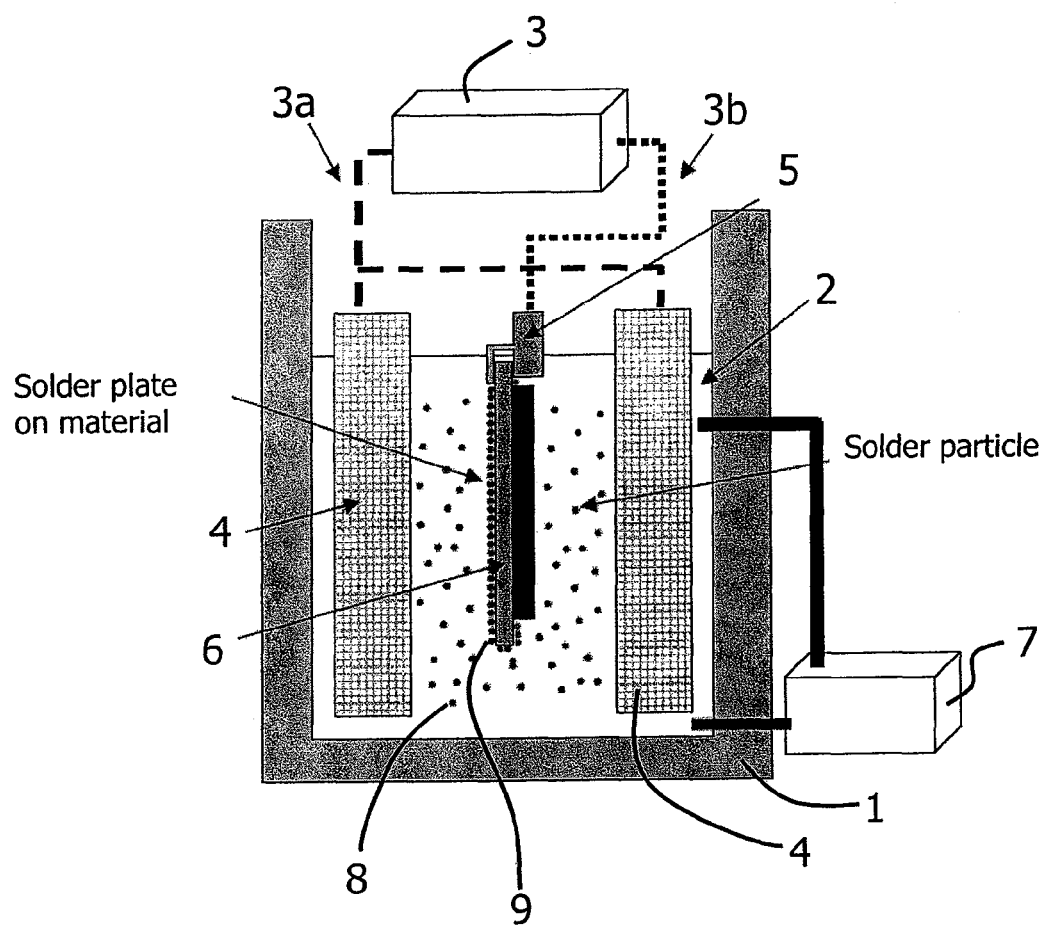
FIG. 1 illustrates a schematic view of a conventional method of electro-plating a strip of semiconductor packages.
Figure 3:
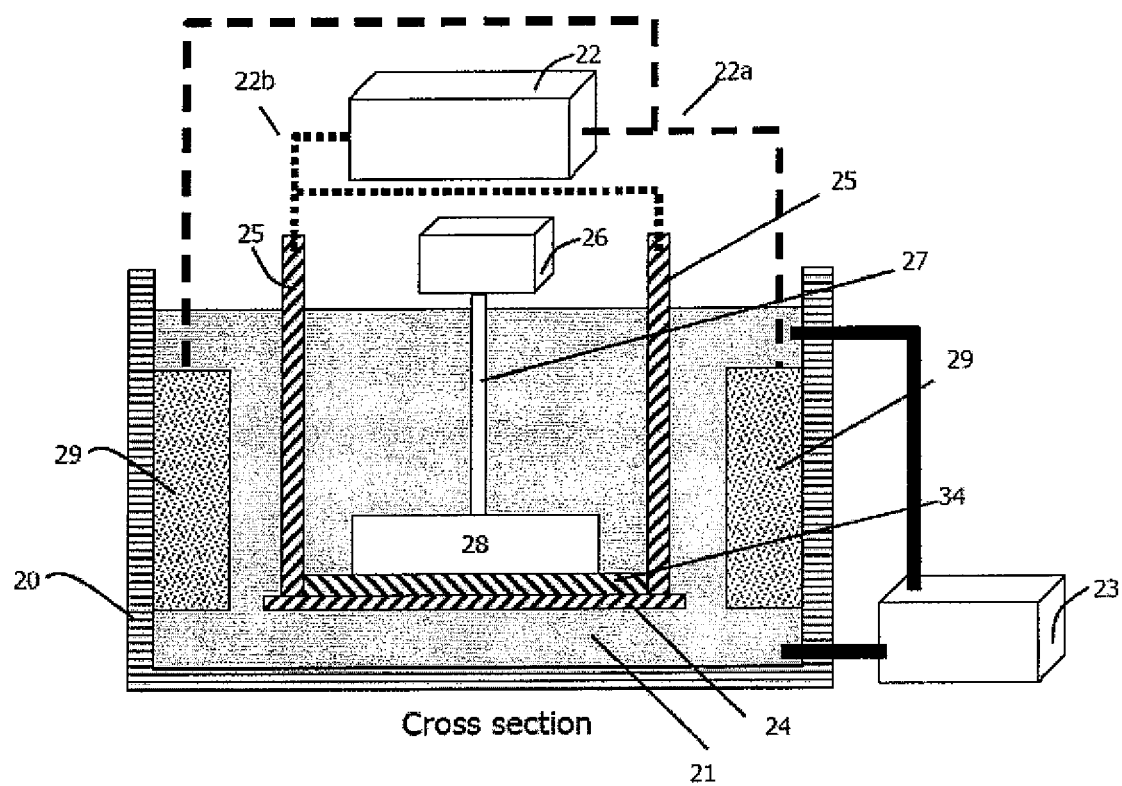
FIG. 3 illustrates a schematic view of an embodiment of the inventive method and apparatus.

Hereinafter, exemplary embodiments of the present invention will be described with reference to the accompanying drawings.

FIGS. 3-6 illustrate schematic views of an embodiment of the inventive method and apparatus. The apparatus includes a container 20 that is filled with a plating chemical 21, such as Methane Sulfonic acid. The container 20 can be made of Poly Propylene. An electrical power source 22 is connected to an anode 22a and a cathode 22b. An example of an electrical power source 22 is a source that outputs 2-3 Volts with a current of approximately 15 Amperes. The anode 22a is electrically connected to a metal basket 29 that contains metal particles, such as solder balls. The cathode 22b is electrically connected to a conductive column 25. The conductive column 25 is electrically connected to a conductive bar 24, on which sits a conductive ring 31. Inside the conductive ring 31 and on top of the conductive bar 24 sits a non-conductive disk 34, which can be made of polyethylene. The apparatus also includes a circulation pump and filter 23, which circulates the chemical in order to prevent chemical debris sediment.

Figure 4:
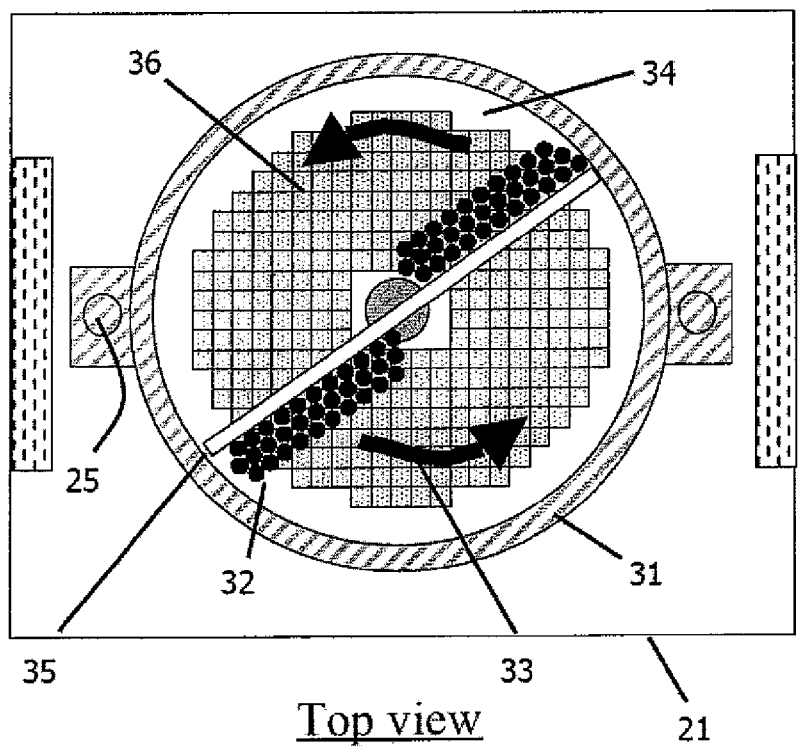
FIG. 4 illustrates a top view of an embodiment of the inventive method and apparatus.
Figure 5:
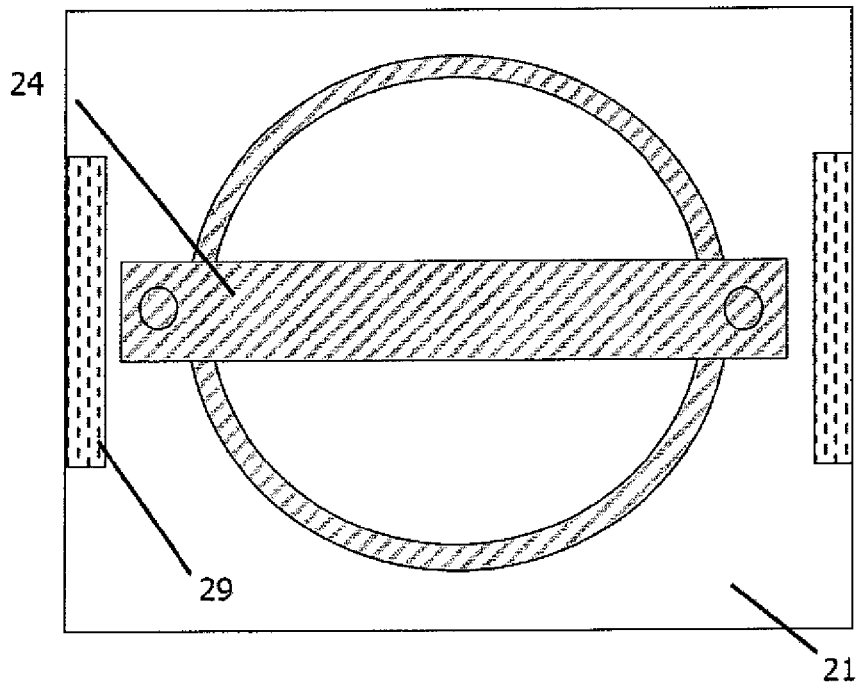
FIG. 5 illustrates a bottom view of an embodiment of the inventive method and apparatus.

The apparatus also includes an agitator 26, which is connected to a buffer unit 28 by an agitator axle 27. The buffer unit 28 contains a stirrer blade 35 which is driven by the agitator 26, which acts as a stirrer. FIG. 4, which is a top view of an embodiment of the apparatus, shows singulated semiconductor packages 36 fixed on a fixture 34 by using, for example, UV tape to fix the unit to fixture 34 with the surface to be plated facing up. The fixture is placed on the non-conductive disk 34. A plurality of conductive parts are then placed inside the conductive ring and on top of the singulated semiconductor packages 36. Typically, enough conductive parts are used so that there are no gaps along the length of stirrer blade 35.

Next, the operation of the apparatus will be described. First, the agitator 26 is turned on, which causes stirrer blade 35 to rotate in direction 33 inside the conductive ring 31 at a rate of approximately 15-20 RPM. The rotating stirrer blade 35 equally spreads the conductive parts 32 over the singulated semiconductor packages. As the conductive parts 32 move about inside the conductive ring 31, they are in electrical contact with both the conductive ring 31 and the metal surfaces of the singulated semiconductor packages. As a result, after the electrical power source 22 is turned on, electrical current is applied by the electrical power source through the cathode 22b, conductive column 25, conductive bar 24, conductive ring 31 and conductive parts to the metal surfaces of the singulated semiconductor packages. The electrical power source 22 also applies electrical current through the anode 22a to the metal baskets 29 that contain metal particles, such as solder balls. The metal particles in the metal baskets then move through the plating chemical and become plated onto the metal surfaces of the singulated semiconductor packages.

Figure 6:
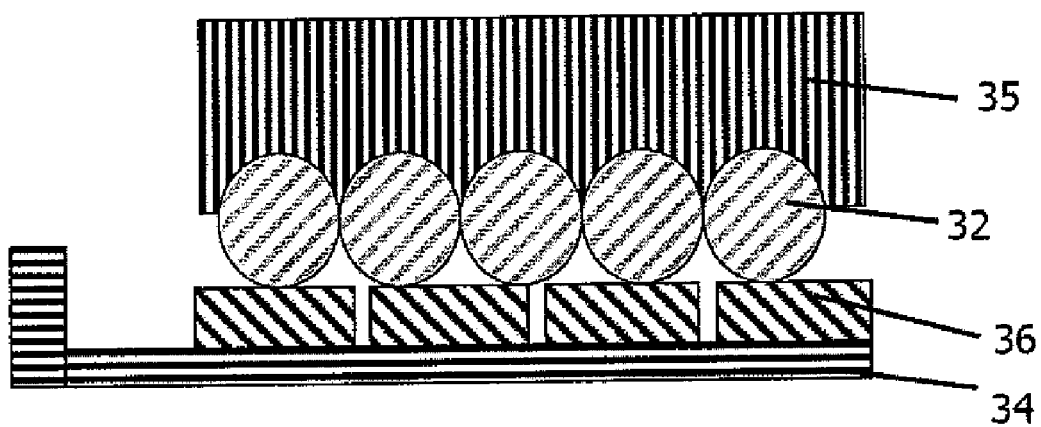
FIG. 6 illustrates a partial side view of an embodiment of the inventive method and apparatus.
Figure 7:
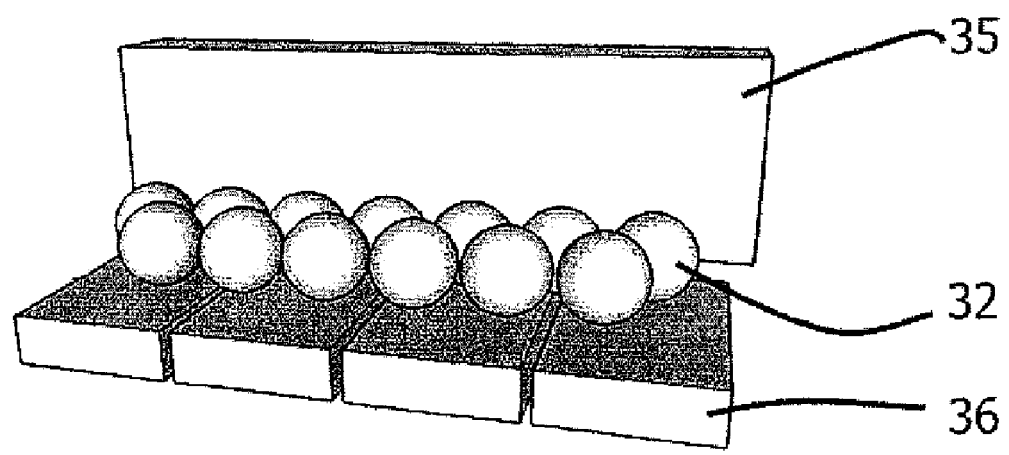
FIG. 7 illustrates a partial perspective view of an embodiment of the inventive method and apparatus.

FIGS. 6 and 7 show other views of how the conductive parts 32 are used in the embodiment. In order to create a uniform plating result, the conductive parts 32 are spread out evenly on the singulated units. The conductive parts 32 conduct the electric current over the plating area which behaves as the cathode. The metal particles, which are driven by an electric field, travel from the metal baskets 29 (anode) to the cathode plating area.

Numerous reliability tests were performed to test the plating method. The results, discussed below, demonstrated that the plating method was just as reliable as conventional plating methods.

FIG. 8 is a table of visual inspection test results of the inventive method. Five lots were inspected, and none were rejected.

FIG. 9 is a table of adhesion test results of the inventive method. Again, five lots were tested, and none were rejected.

FIG. 10 is a table of solderability test conditions that were used to test the inventive method. FIG. 11 is a table of the solderability test results that were obtained. Five lots were inspected, and none were rejected.

Figure 12:
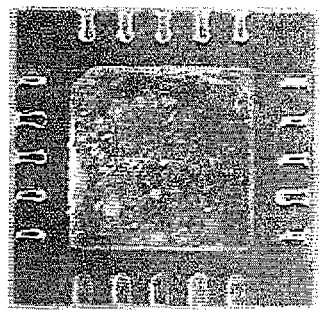
FIG. 12 is a photograph of the unit related to an embodiment of the inventive method.

FIG. 12 is a photograph of the completed unit related to an embodiment of the inventive method.

Figure 13:
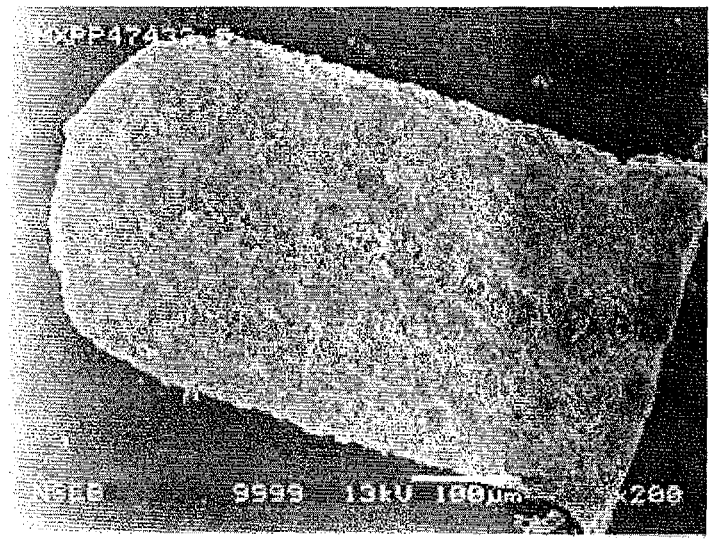
FIGS. 13 are 14 are photograph of whisker test results related to an embodiment of the inventive method.
Figure 14:
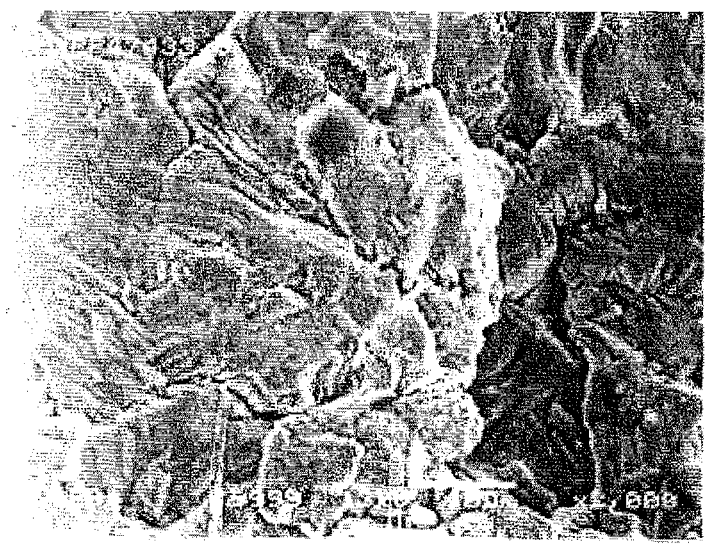

FIGS. 13 are 14 are photograph of whisker test results related to an embodiment of the inventive method. A whisker is a defect that can occur during a solder electroplating process.

Figure 16:
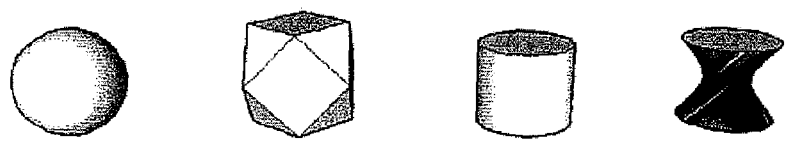
FIG. 16 illustrates different embodiments of the conductive parts.
Figure 17:
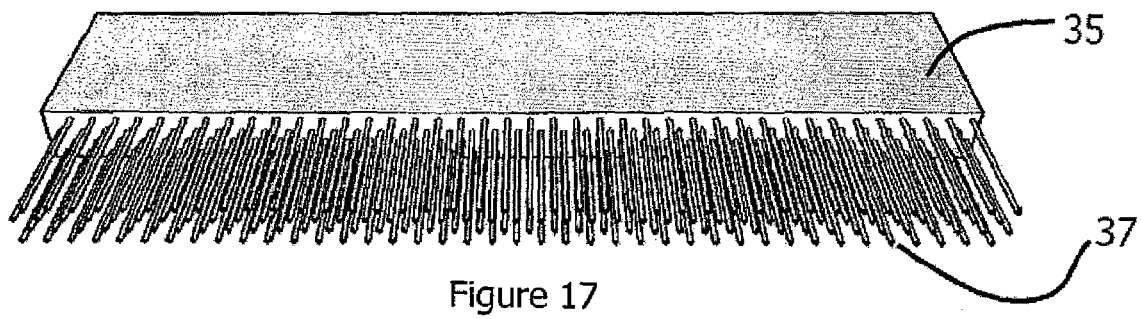
FIGS. 17 and 18 illustrate an alternate embodiment of a stirrer blade of the inventive method and apparatus.
Figure 18:
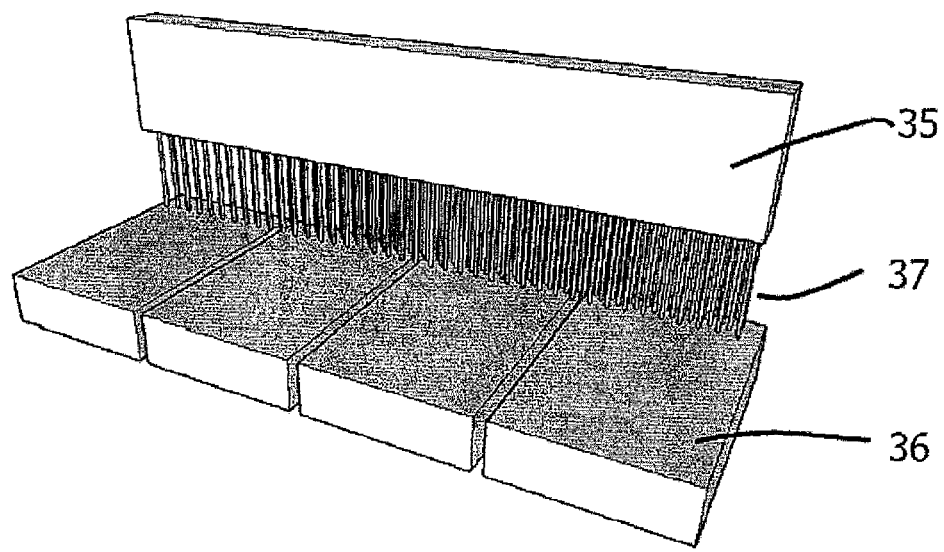
Figure 19:
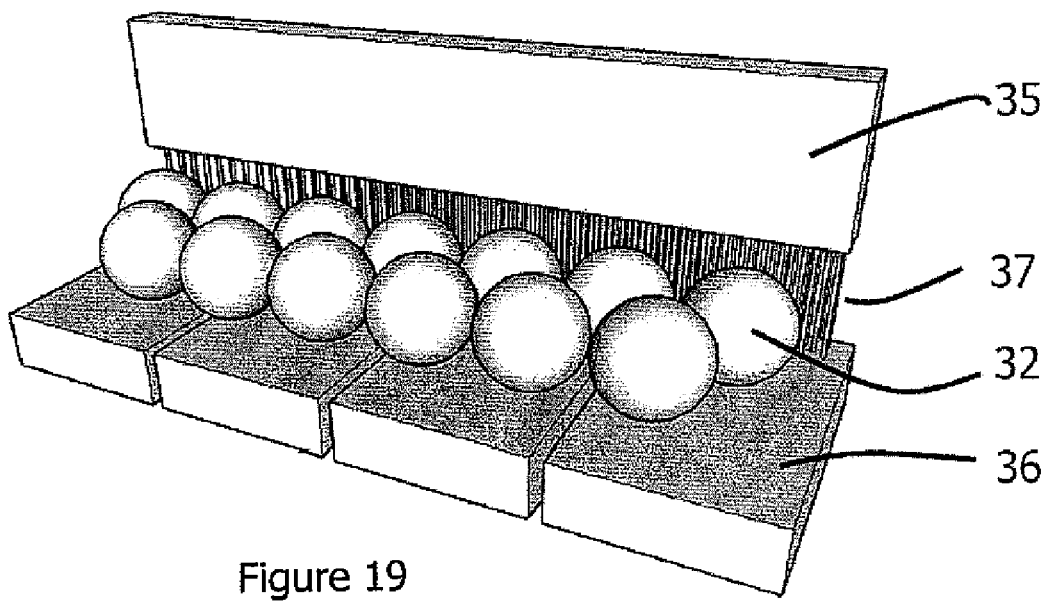
FIG. 19 illustrates an alternate embodiment of a stirrer blade of the inventive method and apparatus.

The embodiment shown in FIGS. 3-7 are only one example of the inventive method. For example, the conductive parts, which are shown as spheres in FIG. 3-7, could also be shaped as cylinders, polyhedrons, etc., or a combination thereof, as shown for example in FIG. 16. In addition, the conductive parts could be hairs, pins, brushes, wheels, etc. that are attached to the stirrer blade. For example FIGS. 17 and 18 which show a brush-like stirrer blade 35 with hairs/pins 37. In addition, different types of conductive parts can used together. For example, FIG. 19 shows a brush-like stirrer blade 35/37 used in combination with conductive spheres 32.

Figure 15A:
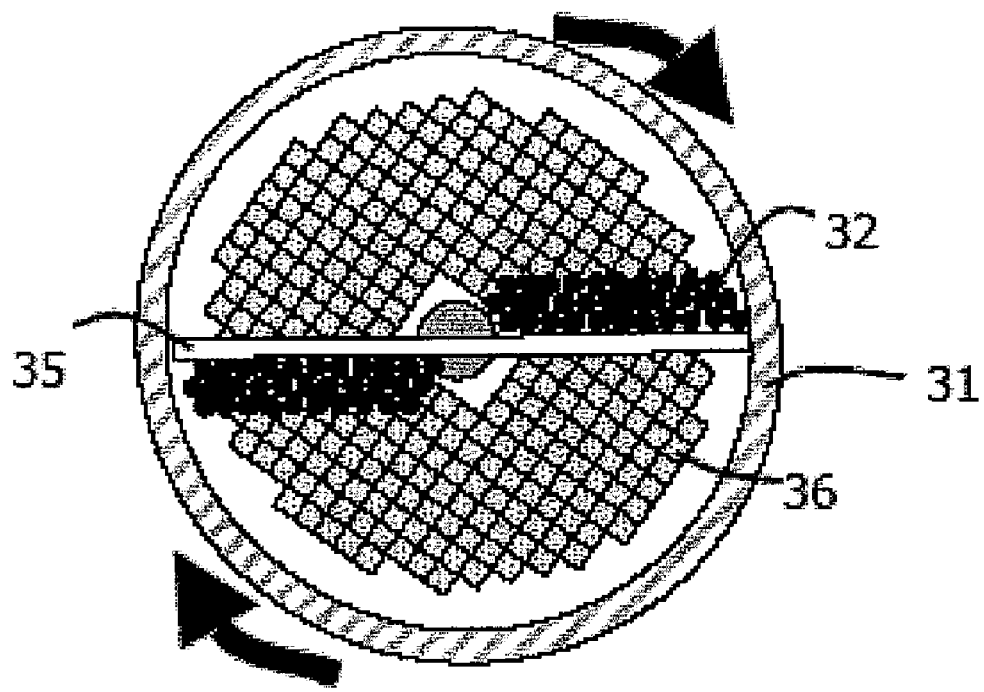
FIGS. 15A and 15B illustrate partial top views of embodiments of the inventive method and apparatus.

In another embodiment of the inventive method and apparatus, the stirrer blade and conductive parts can remain stationary while the semiconductor packages rotate as shown in FIG. 15A. For example, conductive ring 31 would be attached to the non-conductive disk 34, on which the semiconductor packages 36 are fixed. The agitator would then be attached to conductive ring 31. The agitator would then rotate conductive ring 31, non-conductive disk 34 and semiconductor packages 36 together.

Figure 15B:
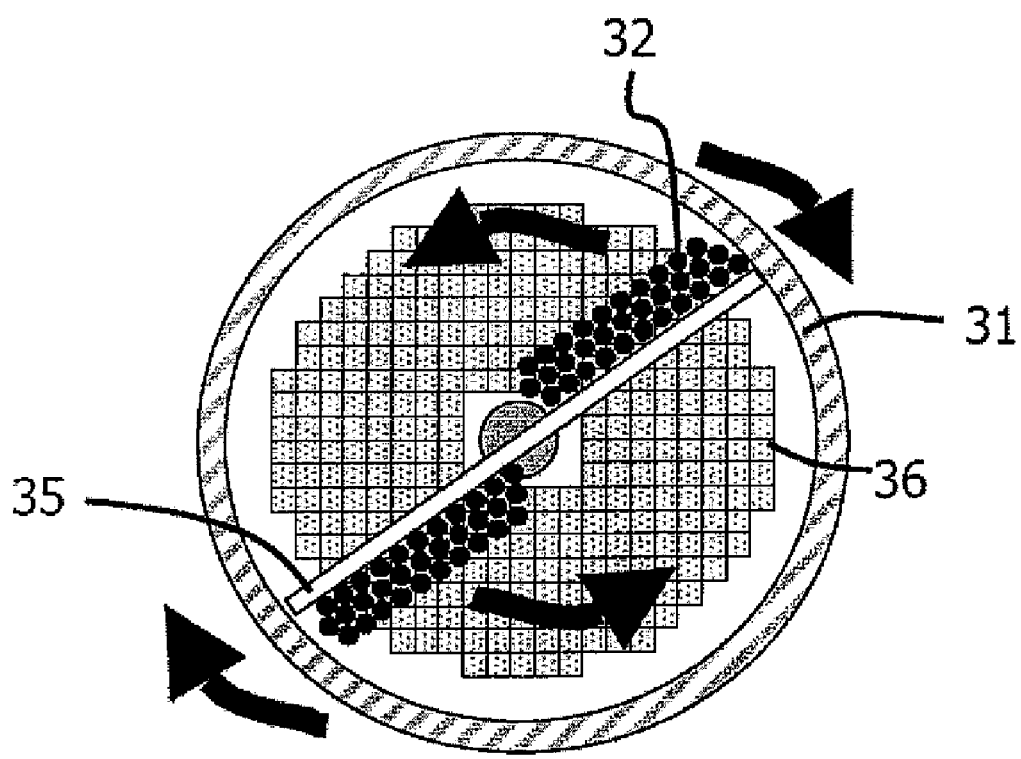

In another embodiment of the inventive method and apparatus, both the stirrer blade/conductive parts and semiconductor packages move, as shown for example in FIG. 15B. This embodiment would require an additional agitator that is attached to conductive ring 31. Also, like the previous embodiment, conductive ring 31 would be attached to the non-conductive disk 34, on which the semiconductor packages 36 are fixed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for plating a plurality of semiconductor devices comprising:
   a container for holding a plating chemical;
   an electrical power source connected to an anode terminal and a cathode terminal;
   a container for holding plating particles connected to said anode terminal;
   a non-conductive platform for holding said plurality of semiconductor devices; and
   movable conductive parts that electrically connect surfaces of said semiconductor devices to be plated to said cathode terminal.

2. The apparatus of claim 1, further comprising:
   a conductive enclosure;
   a conductive plate; and
   a conductive support;
   wherein said conductive enclosure, said conductive plate and said conductive support are electrically connected to said cathode terminal and
   wherein said conductive enclosure provides said electrical connection between said movable conductive parts and said surfaces of said semiconductor devices to be plated to said cathode terminal.

3. The apparatus of claim 2, wherein said conductive enclosure is a ring.

4. The apparatus of claim 2, further comprising:
   a stirrer that moves said conductive parts across said surfaces of said semiconductor devices.

5. The apparatus of claim 2, wherein said conductive parts are shaped as one of spheres, cylinders, polyhedrons, brushes pins, and hairs.

6. The apparatus of claim 1, wherein said plurality of semiconductor devices are not electrically connected.

7. An apparatus for plating a plurality of semiconductor devices comprising:
   a container for holding a plating chemical;
   an electrical power source connected to an anode terminal and a cathode terminal;
   a container for holding plating particles connected to said anode terminal;
   a movable non-conductive platform for holding said plurality of semiconductor devices; and
   conductive parts that electrically connect surfaces of said semiconductor devices to be plated to said cathode terminal.

8. The apparatus of claim 7, wherein said plurality of semiconductor devices are not electrically connected.

* * * * *